US011694938B2

(12) United States Patent
Ohara et al.

(10) Patent No.: US 11,694,938 B2
(45) Date of Patent: Jul. 4, 2023

(54) SEMICONDUCTOR DEVICE

(71) Applicant: Mitsubishi Electric Corporation, Tokyo (JP)

(72) Inventors: Mariko Ohara, Fukuoka (JP); Masatake Harada, Fukuoka (JP); Akira Goto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 578 days.

(21) Appl. No.: 16/522,602

(22) Filed: Jul. 25, 2019

(65) Prior Publication Data

US 2020/0144146 A1 May 7, 2020

(30) Foreign Application Priority Data

Nov. 7, 2018 (JP) .................................. 2018-209421

(51) Int. Cl.
*H01L 23/31* (2006.01)
*H01L 23/08* (2006.01)
(Continued)

(52) U.S. Cl.
CPC .......... *H01L 23/3121* (2013.01); *H01L 23/08* (2013.01); *H01L 23/13* (2013.01);
(Continued)

(58) Field of Classification Search
CPC ..... H01L 23/3121; H01L 23/08; H01L 23/13; H01L 23/3736; H01L 24/48; H01L 2224/48157; H01L 24/49; H01L 24/29; H01L 24/32; H01L 24/45; H01L 24/73; H01L 25/072; H01L 2224/29101; H01L 2224/32225; H01L 2224/451; H01L 2224/48091; H01L 2224/48137; H01L 2224/48227; H01L 2224/48247;
(Continued)

(56) References Cited

U.S. PATENT DOCUMENTS 5,905,301 A * 5/1999 Ichikawa ................ H01L 24/49
257/E23.128
7,361,940 B2 * 4/2008 Kim ........................ H01L 33/62
257/E23.092
(Continued)

FOREIGN PATENT DOCUMENTS

JP H06-062550 U 9/1994
JP 2000-349219 A 12/2000
(Continued)

OTHER PUBLICATIONS

An Office Action; "Notice of Reasons for Refusal", mailed by the Japanese Patent Office dated Oct. 5, 2021, which corresponds to Japanese Patent Application No. 2018-209421 and is related to U.S. Appl. No. 16/522,602; with English language translation.
(Continued)

*Primary Examiner* — Benjamin Tzu-Hung Liu
(74) *Attorney, Agent, or Firm* — Studebaker & Brackett PC

(57) ABSTRACT

A semiconductor device includes a case enclosing a region filled with a sealing material. The case is made of resin. An electrode is fixed to the case. A section, which is a part of the electrode, is provided with a cutout that allows a part of the resin making the case to be exposed to the region.

6 Claims, 7 Drawing Sheets

(51) Int. Cl.
*H01L 23/13* (2006.01)
*H01L 23/373* (2006.01)
*H01L 23/00* (2006.01)

(52) U.S. Cl.
CPC .......... *H01L 23/3736* (2013.01); *H01L 24/48* (2013.01); *H01L 2224/48157* (2013.01)

(58) Field of Classification Search
CPC . H01L 2224/49109; H01L 2224/49111; H01L 2224/73265; H01L 2224/83801; H01L 2924/181; H01L 2924/19107; H01L 23/24; H01L 23/053; H01L 23/49; H01L 23/055

See application file for complete search history.

(56) References Cited

U.S. PATENT DOCUMENTS

| | | | | |
|---|---|---|---|---|
| 10,566,258 | B2* | 2/2020 | Muto | .................. H01L 23/3135 |
| 2004/0150078 | A1* | 8/2004 | Minamio | .......... H01L 23/49541 |
| | | | | 257/669 |
| 2010/0213620 | A1* | 8/2010 | Hamada | .................. H01L 21/56 |
| | | | | 257/E21.59 |
| 2019/0206811 | A1 | 7/2019 | Besshi et al. | |
| 2019/0318971 | A1 | 10/2019 | Ogushi et al. | |

FOREIGN PATENT DOCUMENTS

| | | |
|---|---|---|
| JP | 2004-214294 A | 7/2004 |
| WO | 2018/047659 A1 | 3/2018 |
| WO | 2018/096656 A1 | 5/2018 |

OTHER PUBLICATIONS

An Office Action mailed by China National Intellectual Property Administration dated Feb. 13, 2023, which corresponds to Chinese Patent Application No. 201911059758.1 and is related to U.S. Appl. No. 16/522,602; with English language translation.

An Office Action mailed by the German Patent and Trademark Office dated Mar. 1, 2023, which corresponds to German Patent Application No. 102019216275.4 and is related to U.S. Appl. No. 16/522,602; with English language translation.

* cited by examiner

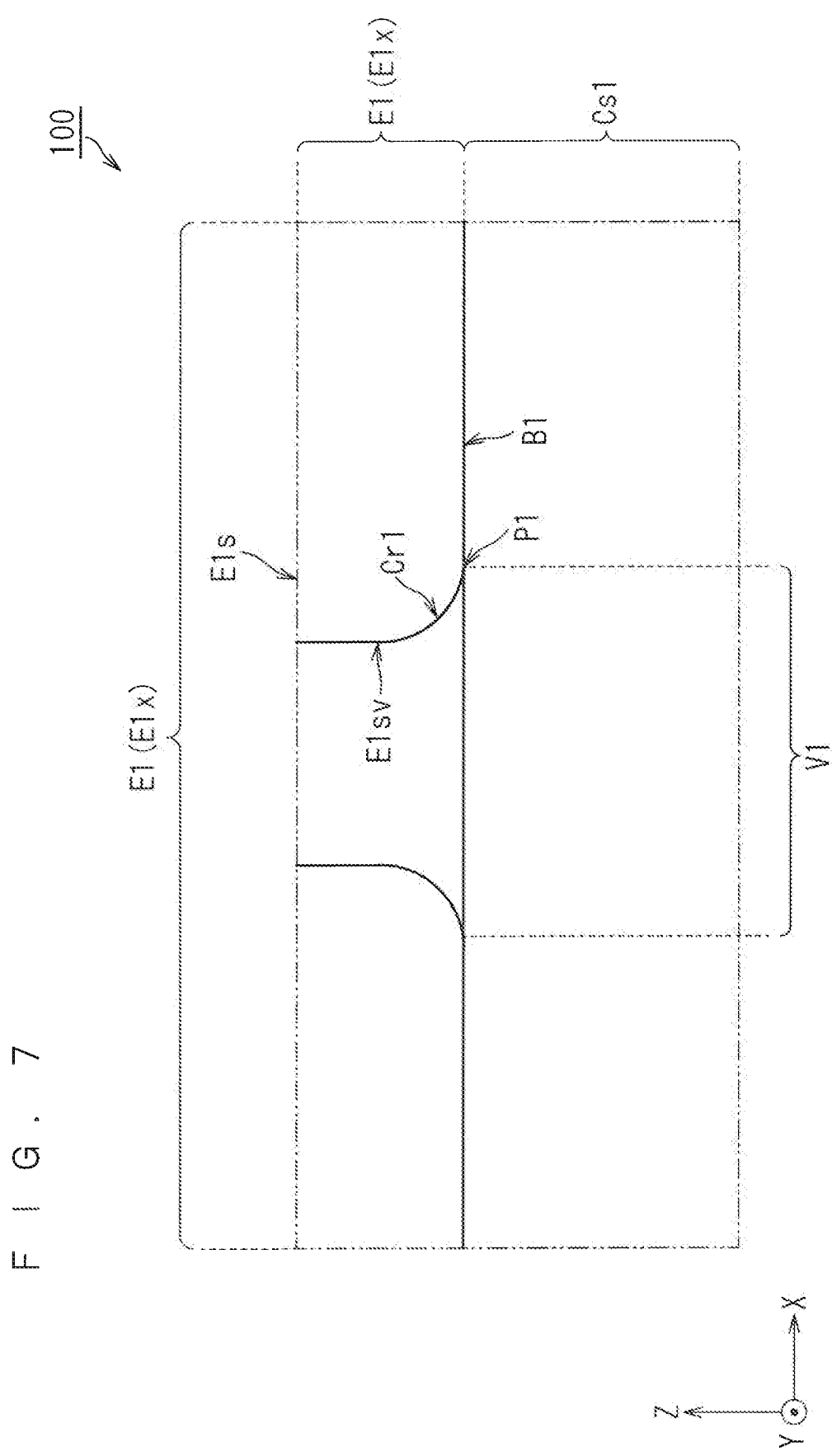

SEMICONDUCTOR DEVICE

BACKGROUND OF THE INVENTION

Field of the Invention

The present invention relates to a semiconductor device including a case to which an electrode is fixed.

Description of the Background Art

In a semiconductor device such as a power module, an electrode as a terminal is fixed in a case. An inside of the case is filled with gel as a sealing material. Moreover, the case is bonded to a heat sink made of metal.

Generally, the case is made of a resin such as plastic or the like. Therefore, adhesion between the electrode (terminal) and the resin (case) is low. This may allow an air bubble to exist between the electrode and the resin (case). If the air bubble exists, various defects occur. In the following description, a situation where the air bubble exists between the electrode and the case (resin) is also referred to as an "air bubble existence situation".

In Japanese Utility Model Application Laid-Open No. H6 (1994)-062550, a configuration has been disclosed to suppress occurrence of a defect related to dielectric breakdown voltage caused by the existence of the air bubble (also referred to as a related configuration A). In the related configuration A, an insulating substrate is laminated on a heat sink. An external lead-out terminal affixed to the insulating substrate has a horizontal portion and a vertical portion. The horizontal portion is affixed to an upper surface of the insulating substrate by solder. By filling an inside of an insulating case with a sealing resin, the insulating substrate and a lower portion of the external lead-out terminal are sealed by the relevant sealing resin.

Moreover, in the related configuration A, an inclined portion is provided between the horizontal portion and the vertical portion in the external lead-out terminal. The inclined portion is provided with a through hole. The existence of the through hole suppresses formation of a gap portion without leaving the air bubble generated when the inside of the case is filled with the sealing resin. This brings about an effect of improving the dielectric breakdown voltage.

In the foregoing configuration in which the electrode is fixed to the case made of the resin, the air bubble existence situation may be caused. In the air bubble existence situation where the air bubble exists between the electrode and the case, there is a problem that if the air bubble expands under a high temperature environment, various defects are caused. As the relevant defects, for example, there is a defect of decrease in insulation. In the related configuration A, this problem cannot be solved.

SUMMARY

An object of the present invention is to provide a semiconductor device that easily solves a situation where an air bubble exists between an electrode and a case.

A semiconductor device according to one aspect of the present invention includes a case enclosing a region filled with a sealing material. The case is made of resin, an electrode is fixed to the case, the electrode has a section in contact with the region, the section being a part of the electrode, the sealing material is provided so that the sealing material at least covers the section, and the section is provided with a cutout that allows a part of the resin making the case to be exposed to the region.

According to the present invention, the semiconductor device includes the case enclosing the region filled with the sealing material. The case is made of the resin. The electrode is fixed to the case. The section, which is a part of the electrode, is provided with the cutout that allows the part of the resin making the case to be exposed to the region.

Thereby, even in the situation where the air bubble exists between the electrode (section) and the case (resin), it becomes easier to solve the relevant situation by the existence of the cutout. Accordingly, the semiconductor device can be provided that easily solves the situation where the air bubble exists between the electrode and the case.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a cross-sectional view of a periphery of the section of the electrode of the semiconductor device having a configuration according to a third modification.

DESCRIPTION OF THE PREFERRED EMBODIMENT

Hereinafter, preferred embodiments will be described with reference to the drawings. In the following drawings, the same components are denoted by the same reference signs. Names and functions of the components denoted by the same reference sign are the same. Therefore, detailed descriptions of a part of the components denoted by the same reference sign may be omitted.

It should be noted that dimensions, a material, a shape, relative arrangement of each of the components, and the like exemplified in the preferred embodiment may be appropriately changed according to a configuration of a device, various conditions, and the like. Moreover, the dimensions of each of the components in each of the drawings may be different from actual dimensions.

First Preferred Embodiment

Figure 1:
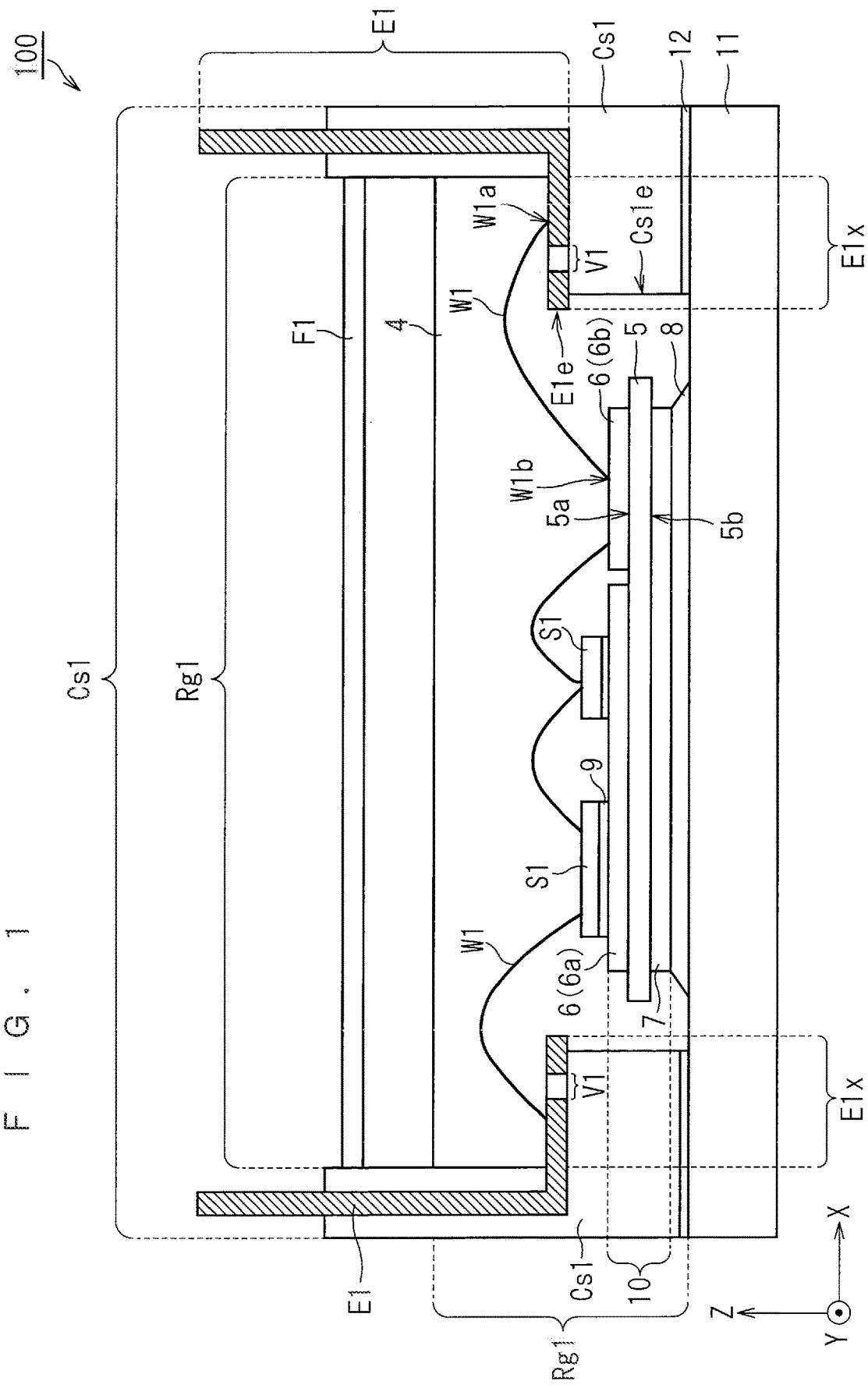
FIG. 1 is a cross-sectional view of a semiconductor device according to a first preferred embodiment.

FIG. 1 is a cross-sectional view of a semiconductor device 100 according to a first preferred embodiment. The semiconductor device 100 is, for example, a power module for a home electric appliance, for industry, for automobile, for train or the like.

In FIG. 1, an X direction, a Y direction, and a Z direction are orthogonal to one another. The X direction, the Y direction, and the Z direction shown in the following figures are also orthogonal to one another. In the following description, a direction including the X direction and a direction opposite to the X direction (−X direction) is also referred to as an "X axis direction". Moreover, in the following description, a direction including the Y direction and a direction opposite to the Y direction (−Y direction) is also referred to as a "Y axis direction". In the following description, a direction including the Z direction and a direction opposite to the Z direction (−Z direction) is also referred to as a "Z axis direction".

In the following description, a plane including the X axis direction and the Y axis direction is also referred to as an "XY plane". In the following description, a plane including the X axis direction and the Z axis direction is also referred to as an "XZ plane". In the following description, a plane including the Y axis direction and the Z axis direction is also referred to as a "YZ plane".

Figure 2:
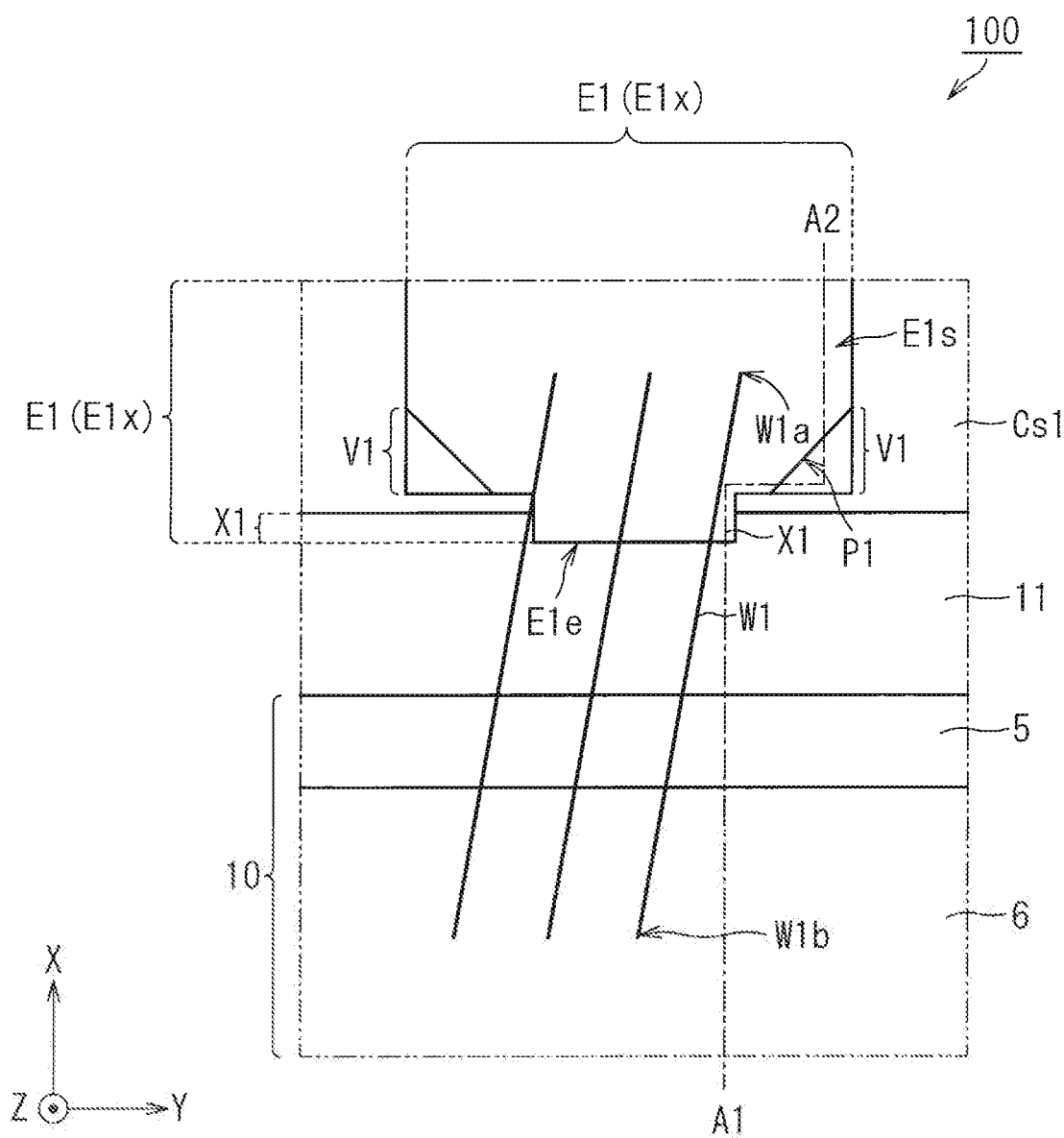
FIG. 2 is a plan view showing a peripheral configuration of a section of an electrode in FIG. 1.
Figure 3:
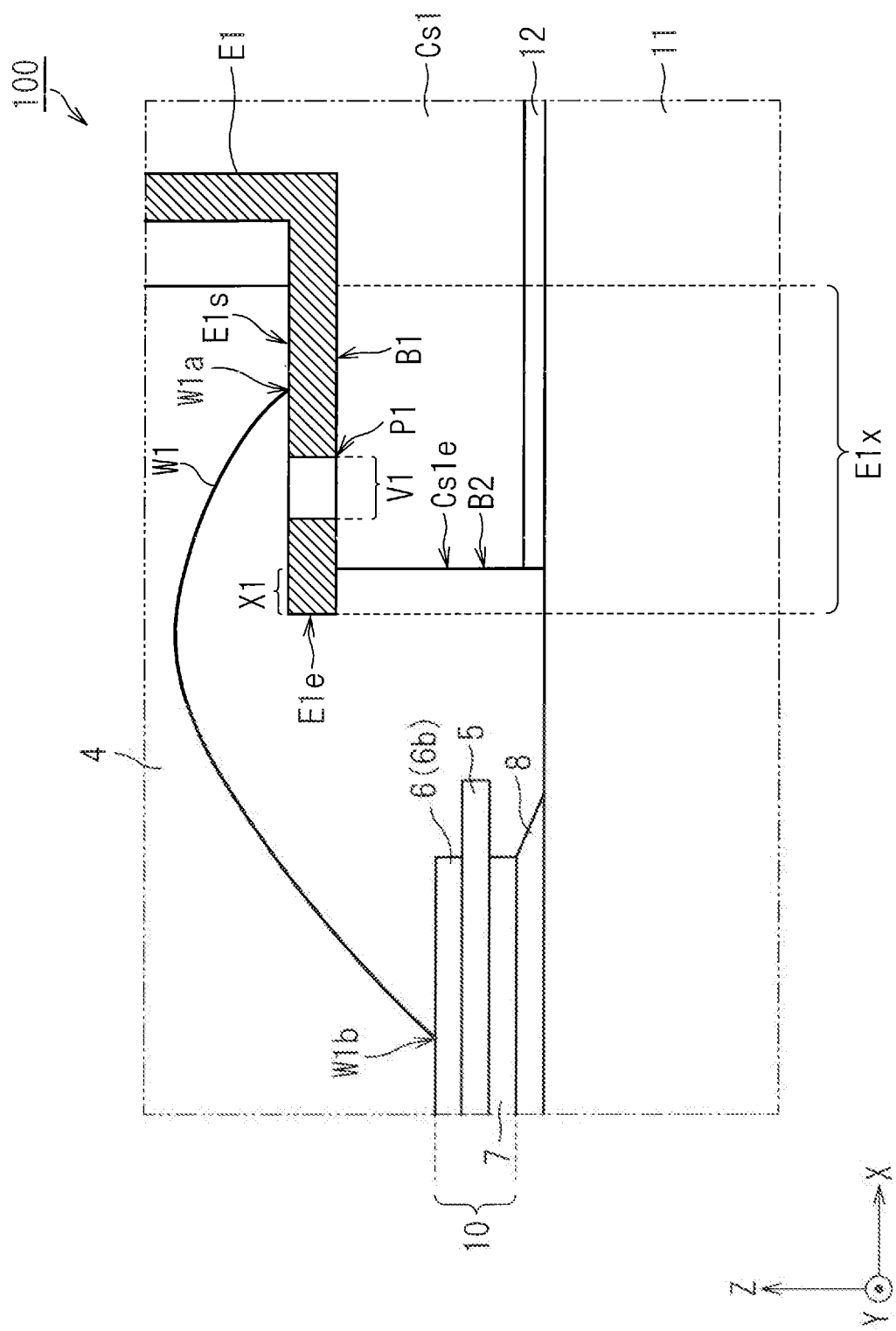
FIG. 3 is a cross-sectional view of the semiconductor device along line A1-A2 in FIG. 2.

FIG. 2 is a plan view showing a peripheral configuration of a section E1x of an electrode E1 described later in FIG. 1. In FIG. 2, a sealing material 4 described later is not shown in order to make the configuration easy to understand. FIG. 3 is a cross-sectional view of the semiconductor device 100 along line A1-A2 in FIG. 2. In FIG. 3, a wire W1 described later and the like are also shown in order to make the configuration easy to understand. FIG. 3 is an enlarged view showing a peripheral configuration of the section E1x described later in FIG. 1.

Referring to FIGS. 1, 2, and 3, the semiconductor device 100 includes a case Cs1, a heat sink 11, a plurality of electrodes E1, a plurality of semiconductor elements S1, a substrate 10, a plurality of wires W1, and a lid F1.

A shape of the case Cs1 is, for example, cylindrical. Moreover, the shape of the case Cs1 in a plan view (XY plane) is a closed loop shape. The case Cs1 has an inner surface Cs1e. A shape of the inner surface Cs1e in a plan view (XY plane) is a closed loop shape. The case Cs1 has insulation. The case Cs1 is made of resin. The relevant resin is, for example, plastic.

Moreover, the respective electrodes E1 are fixed to the case Cs1. Each of the electrodes E1 is an elongated terminal. Each of the electrodes E1 has a forefront E1e. The case Cs1 is bonded to the heat sink 11 through an adhesive agent 12. The heat sink 11 is made of metal (e.g., copper).

The case Cs1 has a region Rg1 as an opening. That is, the case Cs1 encloses the region Rg1. Moreover, the inner surface Cs1e of the case Cs1 encloses a lower portion of the region Rg1. The region Rg1 is filled with the sealing material 4. The sealing material 4 is, for example, gel. Note that the heat sink 11 is in contact with a lower surface of the region Rg1, which is filled with the sealing material 4 (see FIG. 1). The lid F1 is attached to the case Cs1 so as to close the region Rg1 as the opening.

Moreover, each of the electrodes E1 has the section E1x. The section E1x is a part of the electrode E1. A shape of the section E1x is an elongated shape. The section E1x extends toward a central portion of the case Cs1 in a plan view (XY plane). In the following description, a direction in which the section E1x extends is also referred to as a "specific direction". For example, the specific direction in FIGS. 1 and 2 is the X axis direction.

Moreover, the section E1x is in contact with the region Rg1 (sealing material 4). The section E1x has a front surface E1s. That is, the front surface E1s is in contact with the region Rg1 (sealing material 4). Moreover, the section E1x has the forefront E1e. Moreover, the section E1x has a projecting portion X1. A forefront of the projecting portion X1 is the forefront E1e. Moreover, another part of each of the electrodes E1 exists inside the case Cs1.

The sealing material 4 is provided so that the sealing material 4 at least covers the section E1x.

The substrate 10 has insulation. The substrate 10 exists in the region Rg1 filled with the sealing material 4. The substrate 10 is connected to the heat sink 11 through a joining material 8. The joining material 8 is, for example, solder.

The substrate 10 includes an insulating member 5, a plurality of conductive portions 6, and a conductive portion 7. Each of the conductive portions 6, 7 are made of, for example, copper. The insulating member 5 is made of, for example, ceramic. The insulating member 5 has a front surface 5a and a back surface 5b. The conductive portion 7 is joined to the back surface 5b of the insulating member 5. The conductive portion 7 is joined to the heat sink 11 through the joining material 8.

The plurality of conductive portions 6 are joined to the front surface 5a of the insulating member 5. Note that although in FIG. 1, two conductive portions 6 are provided, the number of conductive portions 6 provided in the front surface 5a of the insulating member 5 may be one, or three or more. In the following description, the two conductive portions 6 are also referred to as a conductive portion 6a and a conductive portion 6b, respectively.

Each of the semiconductor elements S1 is, for example, a semiconductor chip such as a semiconductor element for electric power. The relevant semiconductor element for electric power is, for example, a switching element, a diode, or the like. In an upper surface of each of the semiconductor elements S1, a front surface electrode (not shown) is provided. In a lower surface of each of the semiconductor elements S1, a back surface electrode (not shown) is provided.

Each of the semiconductor elements S1 is mounted on the substrate 10. Specifically, the back surface electrode of each of the semiconductor elements S1 is electrically connected to the conductive portion 6a through a joining material 9. The joining material 9 is, for example, solder.

The number of semiconductor elements S1 joined to the conductive portion 6a is not limited to two. The number of semiconductor elements S1 joined to the conductive portion 6a may be one, or three or more.

Each of the electrodes E1 is electrically connected to the semiconductor element S1 or the substrate 10. Specifically, the section E1x of each of the electrodes E1 is connected to the front surface electrode (not shown) of the semiconductor element S1, or the conductive portion 6 (conductive portion 6a or conductive portion 6b) of the substrate 10 through the wire W1. Note that FIG. 3 shows a configuration in which the electrode E1 is electrically connected to the substrate 10. Specifically, FIG. 3 shows a configuration in which the section E1x of the electrode E1 is connected to the conductive portion 6 (conductive portion 6b) of the substrate 10 through the wire W1.

Each of the wires W1 is made of metal. Each of the wires W1 has ends W1a, W1b. The end W1a of each of the wires W1 is connected to the front surface E1s of the section E1x. That is, the front surface E1s is a wire bond surface to which the wire W1 is connected. Moreover, the end W1b of each of the wires W1 is connected to the front surface electrode of the semiconductor element S1, or the conductive portion 6 (conductive portion 6a or conductive portion 6b) of the substrate 10. In the following description, a position where the end W1a of the wire W1 is connected in the front surface E1s of the section E1x is also referred to as a "wire bond point".

Next, a characteristic configuration of the present preferred embodiment (hereinafter, also referred to as a "configuration Ct1") will be described. In the following description, as one example, one electrode E1 included in the plurality of electrodes E1 will be described. The relevant one electrode E1 is the right electrode E1 of the two electrodes E1 shown in FIG. 1.

Referring to FIGS. 2 and 3, the section E1x of the electrode E1 is provided with cutouts V1. Moreover, the cutouts V1 are provided in the front surface E1s of the section E1x. In FIG. 2, a configuration is shown in which the number of cutouts V1 provided in the section Ex1 is two. Note that the number of cutouts V1 provided in the section E1x may be one.

In the following description, a boundary between the section E1x of the electrode E1 and the case Cs1 is also referred to as a "boundary B1" (see FIG. 3). The cutout V1 extends up to the boundary B1. The cutout V1 allows a part of the resin making the case Cs1 to be exposed to the region Rg1.

Moreover, the cutout V1 is closer to the central portion of the case Cs1 than the end W1a (wire bond point) in the specific direction (X axis direction). Specifically, the end W1b is closer to the central portion of the case Cs1 than the end W1a in the specific direction (X axis direction). The cutout V1 exists between the end W1a (wire bond point) and the end W1b in the specific direction (X axis direction).

(Conclusion)

As described above, according to the present preferred embodiment, the semiconductor device 100 includes the case Cs1 enclosing the region Rg1 filled with the sealing material 4. The case Cs1 is made of resin. The electrodes E1 are each fixed to the case Cs1. The section E1x, which is a part of the electrode E1, is provided with the cutout V1 that allows a part of the resin making the case Cs1 to be exposed to the region Rg1.

Thereby, even in the situation where an air bubble exists between the electrode (section) and the case (resin), it becomes easier to solve the relevant situation by the existence of the cutout V1. Accordingly, the semiconductor device can be provided that easily solves the situation where the air bubble exists between the electrode and the case.

In the following description, a position corresponding to an end of the cutout V1 in the boundary B1 is also referred to as a "position P1" (see FIGS. 2 and 3). In the following description, the situation where the air bubble exists between the section E1x of the electrode E1 and the case Cs1 (resin) (at the boundary B1) is also referred to as an "air bubble existence situation". In the following description, a boundary between the inner surface Cs1e of the case Cs1, and the sealing material 4 is also referred to as a "boundary B2" (see FIG. 3). Moreover, in the following description, a situation where the semiconductor device 100 exists under high temperature environment is also referred to as a "high temperature situation".

According to the present preferred embodiment, the section E1x of the electrode E1 is provided with the cutout V1 (see FIGS. 2 and 3). Moreover, the cutout V1 is provided in the front surface E1s of the section E1x. The cutout V1 extends up to the boundary B1.

This allows, for example, the air bubble to move to a side of the front surface E1s (wire bond surface) of the section E1x from the position P1 in FIG. 3 through the cutout V1 even in the air bubble existence situation. Therefore, even in the air bubble existence situation and in the high temperature situation, the air bubble can be restrained from expanding and moving to the boundary B2.

Moreover, according to the present preferred embodiment, the cutout V1 is closer to the central portion of the case Cs1 than the end W1a (wire bond point) in the specific direction (X axis direction). That is, in FIG. 3, the cutout V1 is closer to the position P1 than the projecting portion X1. Therefore, even in the air bubble existence situation and in the high temperature situation, the air bubble can be restrained from expanding and moving to the boundary B2.

Accordingly, the air bubble does not grow up to the boundary B2. This brings about an effect that insulation between the electrode E1 (section E1x) and the heat sink 11 can be secured.

Note that in a conventional semiconductor device not having the configuration Ct1, there is a problem that in the air bubble existence situation and in the high temperature situation, for example, expansion of an air bubble decreases the insulation between an electrode and a heat sink.

Therefore, the semiconductor device 100 of the present preferred embodiment has the configuration for exerting the foregoing effect. Thus, the semiconductor device 100 of the present preferred embodiment can solve the foregoing problem.

Note that the case Cs1 of the preset preferred embodiment may be a case having a structure in which each of the electrodes is fitted in the case after molding to be fixed (so-called outsert case structure). Moreover, the case Cs1 of the present preferred embodiment may be a case having a structure in which a case and each of the electrodes are integrally fixed by insert molding (so-called insert case structure).

In the outsert case structure, since a gap between the electrode and the case is wide, the air bubble is easily generated between the electrode and the case. In the insert case structure, the gap between the electrode and the case is narrow, and when the air bubble expands, the air bubble tends to easily move up to the boundary B2. Therefore, the configuration of the present preferred embodiment is effective to both situations where the structure of the case Cs1 is the outsert case structure, and is the insert case structure.

<First Modification>

In the following description, a configuration of the present modification is also referred to as a "configuration Ctm1". The configuration Ctm1 is a configuration in which the section E1x of the electrode E1 is provided with a plurality of cutouts V1. Moreover, the configuration Ctm1 is a configuration in which the number of cutouts V1 is increased as compared with the configuration Ct1. The configuration Ctm1 is applied to the configuration Ct1.

Figure 4:
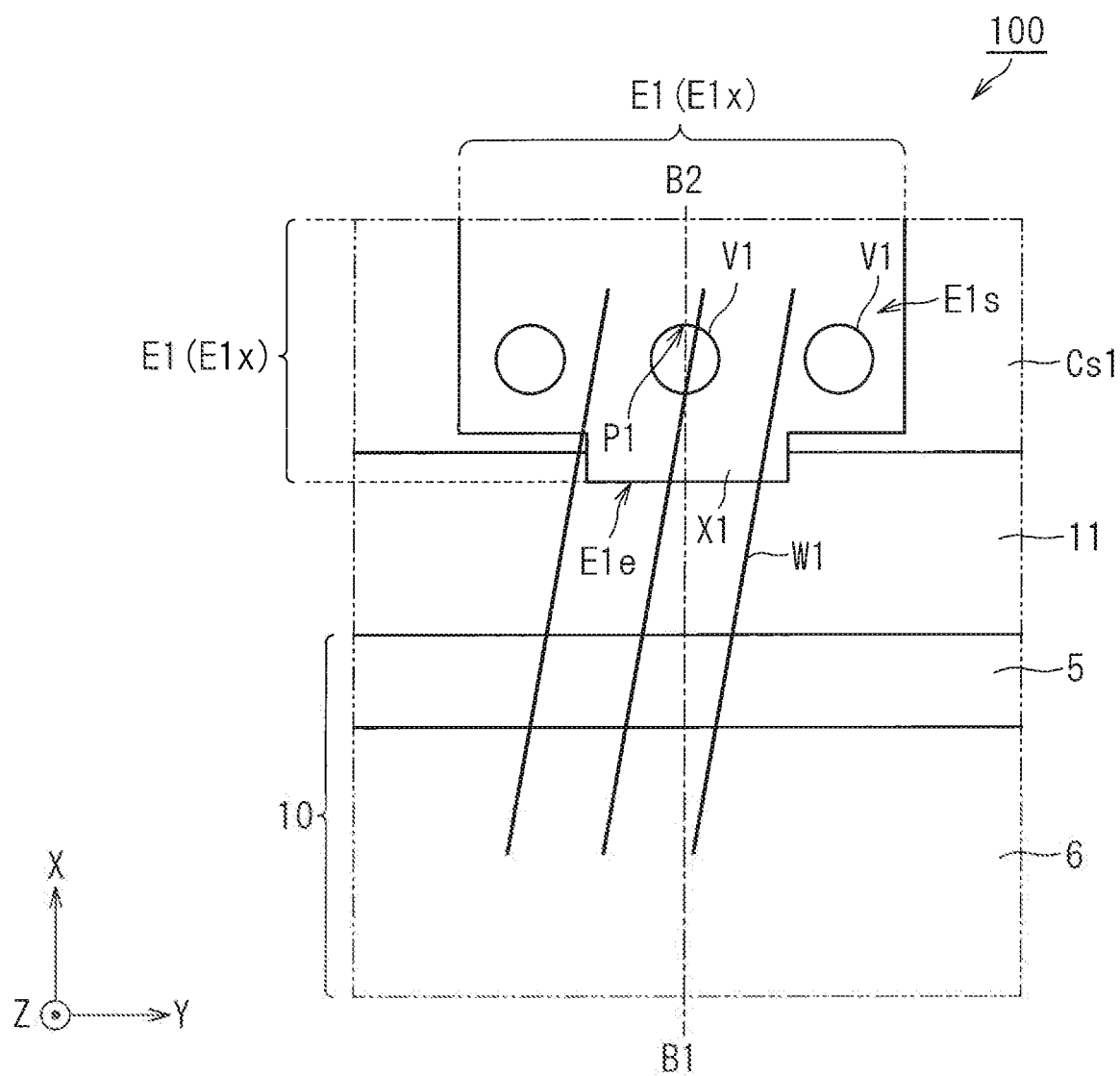
FIG. 4 is a plan view showing a peripheral configuration of the section of the electrode in a configuration of a first modification.

FIG. 4 is a plan view showing a peripheral configuration of the section E1x of the electrode E1 in the configuration Ctm1 of a first modification. Note that a cross-sectional view of the semiconductor device 100 along line B1-B2 in FIG. 4 is FIG. 3. As described before, in FIG. 3, the wire W1 and the like are also shown in order to make the configuration easy to understand.

Referring to FIG. 4, the section E1x of the electrode E1 is provided with the plurality of cutouts V1. A shape of each of the cutouts V1 in a plan view (XY plane) is circular. Note that the shape of each of the cutouts V1 in a plan view (XY plane) may be a shape other than a circle (e.g., rectangular).

Each of the cutouts V1 in the configuration Ctm1 allows a part of the resin making the case Cs1 to be exposed to the region Rg1. Moreover, the cutouts V1 in the configuration Ctm1 extend up to the boundary B1, as shown in FIG. 3.

(Conclusion)

As described above, according to the configuration Ctm1 of the present modification, the section E1x of the electrode E1 is provided with the plurality of cutouts V1. Moreover, the number of cutouts V1 provided in the section E1x in the configuration Ctm1 is larger than that in the configuration Ct1.

This allows the air bubble to more easily move to the side of the front surface E1s (wire bond surface) of the section E1x from the position P1 in FIG. 3 through each of the cutouts V1 even in the air bubble existence situation. Accordingly, the air bubble does not grow up to the boundary B2. Therefore, the insulation between the electrodes E1 (section E1x) and the heat sink 11 can be sufficiently secured.

Note that the number of cutouts V1 provided in the section E1x of the electrode E1 may be four or more.

<Second Modification>

In the following description, a configuration of the present modification is also referred to as a "configuration Ctm2". The configuration Ctm2 is a configuration in which the cutout V1 extents up to the forefront E1e of the electrode E1. The configuration Ctm2 is applied to all or a part of the configuration Ct1 and the configuration Ctm1.

As one example, the configuration Ct1 to which the configuration Ctm2 is applied (hereinafter, also referred to as a "configuration Ct1m2") is now described. The configuration Ct1m2 is a configuration in which the configuration Ctm2 is applied to the configuration in FIG. 2.

Figure 5:
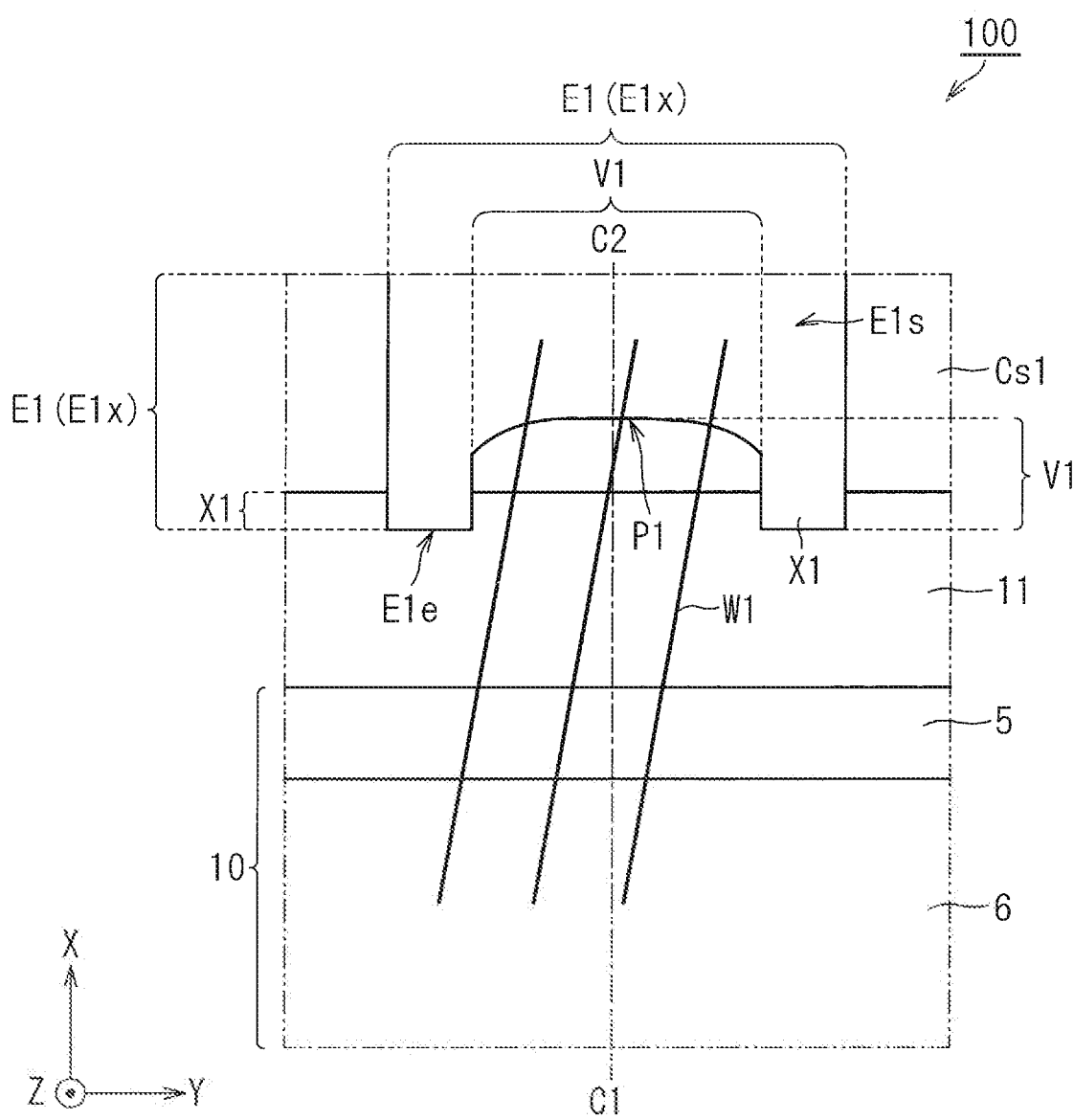
FIG. 5 is a plan view showing a peripheral configuration of the section of the electrode of the semiconductor device having a configuration according to a second modification.
Figure 6:
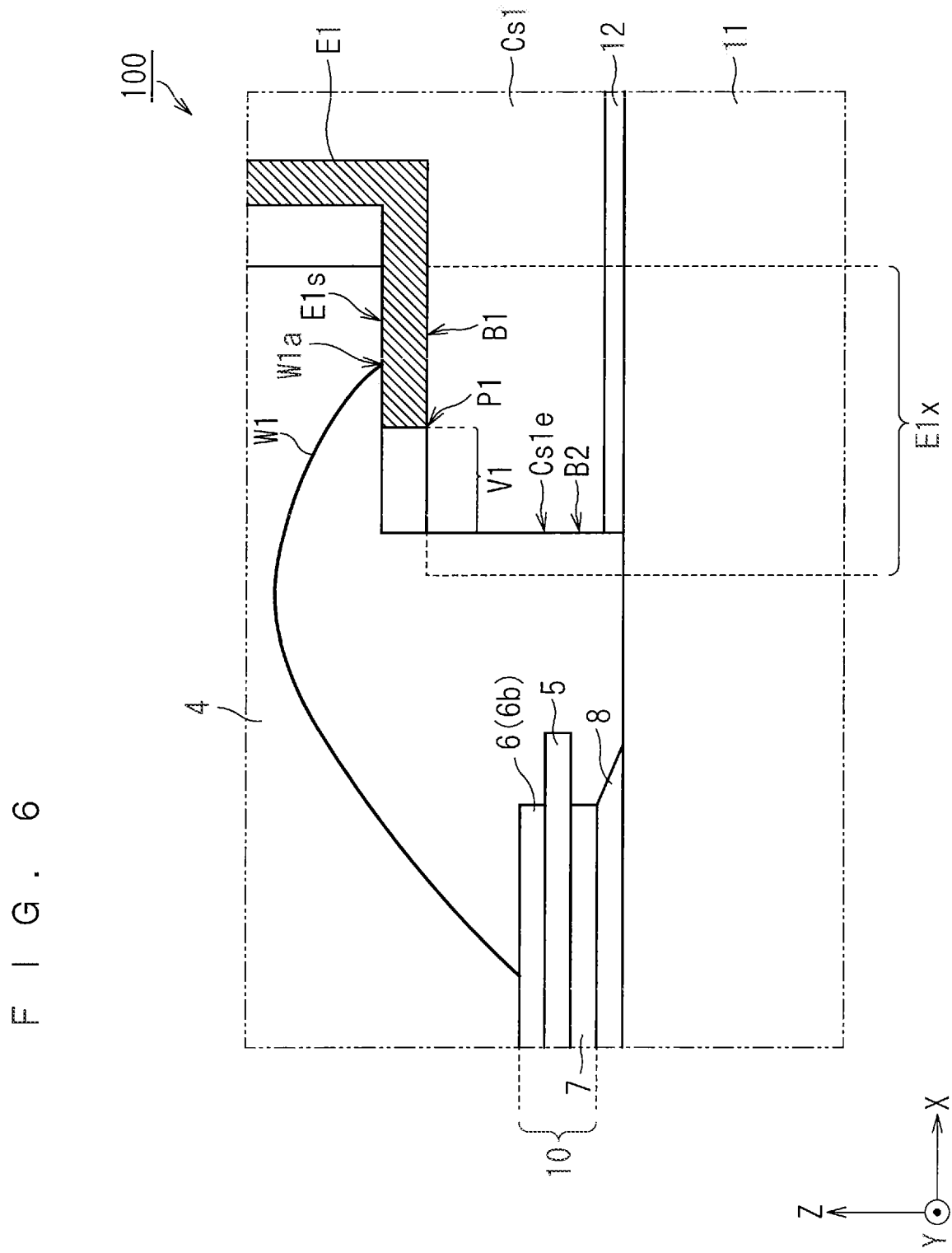
FIG. 6 is a cross-sectional view of the semiconductor device along line C1-C2 in FIG. 5.

FIG. 5 is a plan view showing a peripheral configuration of the section E1x of the electrode E1 of the semiconductor device 100 having the configuration Ct1m2 according to a second modification. FIG. 6 is a cross-sectional view of the semiconductor device 100 along line C1-C2 in FIG. 5. In FIG. 6, the wire W1 and the like are also shown in order to make the configuration easy to understand. Moreover, in order to make the configuration easier to understand, in FIG. 6, a range of a longest portion of the section Ex1 in FIG. 5 in the X axis direction is shown as a range of the section. E1x.

Referring to FIG. 5, in the configuration Ctm2, the cutout V1 provided in the section E1x of the electrode E1 extends up to the forefront E1e of the electrode E1.

(Conclusion)

As described above, according to the present modification, the cutout V1 extends up to the forefront E1e of the electrode E1. This allows the air bubble to more easily move to the side of the front surface E1s (wire bond surface) of the section E1x from the position P1 in FIG. 6 through the cutout V1 even in the air bubble existence situation. Accordingly, the air bubble does not grow up to the boundary B2. Therefore, the insulation between the electrodes E1 (section E1x) and the heat sink 11 can be sufficiently secured.

<Third Modification>

In the following description, a configuration of the present modification is also referred to as a "configuration Ctm3". The configuration Ctm3 is a configuration in which the cutout V1 has a characteristic shape. The configuration Ctm3 is applied to all or a part of the configuration Ct1, the configuration Ctm1, and the configuration Ctm2.

As one example, the configuration Ct1 to which the configuration Ctm3 is applied (hereinafter, also referred to as a "configuration Ct1m3") is now described. The configuration Ct1m3 is a configuration in which the configuration Ctm3 is applied to the configuration in FIG. 3.

FIG. 7 is a cross-sectional view of a periphery of the section E1x of the electrode E1 of the semiconductor device 100 having the configuration Ct1m3 according to a third modification. Moreover, FIG. 7 is a view showing a shape of the cutout V1 to which the configuration Ctm3 is applied. In the following description, a surface of the section E1x in contact with the cutout V1 is also referred to as an "inner surface E1sv" (see FIG. 7).

Referring to FIG. 7, in the configuration Ct1m3, the inner surface E1sv of the section E1x has a curved surface Cr1 as a sag surface. The curved surface Cr1 is configured so that in the air bubble existence situation, the air bubble easily moves to the side of the front surface E1s (wire bond surface) of the section E1x along the curved surface Cr1. The curved surface Cr1 corresponds to a lower portion (a part) of the inner surface E1sv.

Specifically, in the configuration Ct1m3, the cutout V1 is configured so that a portion of the cutout V1 closer to the boundary B1 has a larger cross-sectional area.

CONCLUSION

As described above, according to the present modification, the inner surface E1sv in contact with the cutout V1 in the section E1x has the curved surface Cr1 as the sag surface. Specifically, the cutout V1 is configured so that the portion of the cutout V1 closer to the boundary B1 has a larger cross-sectional area. This allows the air bubble to more easily move to the side of the front surface E1s (wire bond surface) of the section E1x from the position P1 in FIG. 7 through the curved surface Cr1 in the air bubble existence situation.

Note that, within the scope of the invention, the present invention can freely combine the preferred embodiment and the modifications, and can appropriately modify and omit the preferred embodiment and the modifications.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a case enclosing a region filled with a sealing material, wherein
   the case is made of resin,
   an electrode is fixed to the case,
   the electrode has a section in contact with the region, the section being a part of the electrode,
   the sealing material is provided so that the sealing material at least covers the section,
   the section is provided with a cutout that allows a part of the resin making the case to be exposed to the region,
   the cutout extends up to a boundary between the section and the case,
   the cutout is configured so that a portion of the cutout closer to the boundary has a larger cross-sectional area,
   in a same cross-section, a top of the cutout has a different cross-sectional area from a bottom of the cutout,
   the section has an inner surface in contact with the cutout,
   a part of the inner surface of the section is a curved surface,
   a shape of the section is an elongated shape,
   in plan view, a shape of the cutout provided in the section is circular, and
   a diameter of the cutout, whose shape is circular, is shorter than a length of the section in a short length direction of the section.

2. The semiconductor device according to claim 1, wherein
    the section is provided with a plurality of cutouts including the cutout.

3. The semiconductor device according to claim 1, wherein
    the section has a forefront of the electrode, and
    the cutout extends up to the forefront of the electrode.

4. The semiconductor device according to claim 1 wherein
    the section extends toward a central portion of the case in a plan view,
    the semiconductor device includes a wire having a first end and a second end,
    the first end of the wire is connected to a front surface of the section,
    the second end is closer to the central portion of the case than the first end in a specific direction, which is a direction in which the section extends, and
    in the specific direction, the cutout exists between the first end and the second end.

5. The semiconductor device according to claim 1, wherein
    the case is bonded to a heat sink in contact with a lower surface of the region filled with the sealing material, and
    the heat sink is made of metal.

6. The semiconductor device according to claim 5, wherein
    in the region filled with the sealing material, a substrate on which a semiconductor element is mounted exists,
    the substrate is connected to the heat sink, and
    the electrode is electrically connected to the semiconductor element or the substrate.

* * * * *